(12) United States Patent
Allison et al.

(10) Patent No.: US 8,806,283 B1
(45) Date of Patent: Aug. 12, 2014

(54) AUTOMATIC AND ON-DEMAND TESTING OF NON-VOLATILE STORAGE DEVICES

(75) Inventors: Michael S. Allison, Fort Collins, CO (US); Nathan J. Hughes, Fort Collins, CO (US); Stephen J. Silva, Fort Collins, CO (US); John A. Strange, Fort Collins, CO (US)

(73) Assignee: Western Digital Technologies, Inc., Irvine, CA (US)

(*) Notice: Subject to any disclaimer, the term of this patent is extended or adjusted under 35 U.S.C. 154(b) by 181 days.

(21) Appl. No.: 13/327,535

(22) Filed: Dec. 15, 2011

(51) Int. Cl.
| | |
|---|---|
| *G11C 29/00* | (2006.01) |
| *G06F 11/00* | (2006.01) |
| *G06F 11/22* | (2006.01) |
| *G11C 29/46* | (2006.01) |
| *G11C 29/48* | (2006.01) |
| *G11C 29/52* | (2006.01) |
| *G06F 3/06* | (2006.01) |
| *G06F 11/10* | (2006.01) |
| *G01R 31/317* | (2006.01) |
| *G01R 31/28* | (2006.01) |

(52) U.S. Cl.
CPC .......... *G06F 11/2284* (2013.01); *G11C 29/46* (2013.01); *G11C 29/48* (2013.01); *G11C 29/52* (2013.01); *G11C 29/765* (2013.01); *G06F 11/22* (2013.01); *G06F 3/0689* (2013.01); *G06F 11/1008* (2013.01); *G01R 31/31701* (2013.01); *G06F 3/0679* (2013.01); *G01R 31/2808* (2013.01); *G06F 3/068* (2013.01)
USPC ............... 714/718; 714/742; 714/14; 714/30; 714/36; 365/200; 365/201

(58) Field of Classification Search
CPC . G06F 11/2284; G06F 11/22; G06F 11/1008; G06F 3/0679; G06F 3/068; G06F 3/0689; G06F 2011/2278; G06F 2212/7209; G06F 2212/214; G11C 29/46; G11C 29/48; G11C 29/52; G11C 29/765; G01R 31/31701; G01R 31/2801; G01R 31/2808
USPC ......... 714/718, 742, 14, 30, 36; 365/200, 201
See application file for complete search history.

(56) References Cited

U.S. PATENT DOCUMENTS

| | | | |
|---|---|---|---|
| 5,130,645 A | 7/1992 | Levy | |
| 5,159,183 A * | 10/1992 | Yamaguchi | 235/492 |
| 5,592,616 A | 1/1997 | Finch et al. | |
| 5,768,585 A * | 6/1998 | Tetrick et al. | 713/2 |
| 6,466,048 B1 * | 10/2002 | Goodman | 326/8 |
| 6,664,803 B2 * | 12/2003 | Goodman | 326/8 |
| 6,681,354 B2 | 1/2004 | Gupta | |
| 6,839,873 B1 | 1/2005 | Moore | |
| 7,009,419 B2 * | 3/2006 | Goodman | 326/8 |
| 7,117,416 B1 | 10/2006 | Fox | |
| 7,155,644 B2 * | 12/2006 | Roohparvar | 714/718 |
| 7,284,166 B2 | 10/2007 | Zappa et al. | |
| 7,392,148 B2 * | 6/2008 | Basham et al. | 702/122 |
| 7,409,610 B1 | 8/2008 | Drimer | |

(Continued)

*Primary Examiner* — John J Tabone, Jr.

(57) ABSTRACT

Systems and methods for testing non-volatile storage devices are disclosed that provide functionality to control when testing of the non-volatile storage device is performed. In one embodiment, information stored in persistent memory indicates whether testing is enabled or disabled. For example, the testing information may indicate that testing is to be performed upon a first initialization of a non-volatile storage device, but not in connection with subsequent power-up events. Furthermore, functionality is disclosed for re-running and/or bypassing testing of the non-volatile storage device.

14 Claims, 5 Drawing Sheets

(56) References Cited

U.S. PATENT DOCUMENTS

| | | |
|---|---|---|
| 7,421,635 B2 | 9/2008 | Shin et al. |
| 7,475,315 B1 | 1/2009 | Natarajan et al. |
| 7,730,368 B2 * | 6/2010 | Murin et al. .................. 714/718 |
| 7,761,763 B2 | 7/2010 | Shin et al. |
| 8,069,380 B2 * | 11/2011 | Murin et al. .................. 714/718 |
| 8,078,421 B1 * | 12/2011 | Shastry et al. ................ 702/115 |
| 2002/0104051 A1 | 8/2002 | Gupta |
| 2004/0155301 A1 | 8/2004 | Zhang |
| 2004/0262731 A1 | 12/2004 | Zhang |
| 2005/0204233 A1 | 9/2005 | Shin et al. |
| 2008/0313515 A1 | 12/2008 | Shin et al. |
| 2010/0023745 A1 * | 1/2010 | Wu ................................... 713/2 |
| 2011/0041017 A1 | 2/2011 | Zhong et al. |

\* cited by examiner

AUTOMATIC AND ON-DEMAND TESTING OF NON-VOLATILE STORAGE DEVICES

BACKGROUND

1. Technical Field

This disclosure relates to non-volatile storage subsystems, including but not limited to non-volatile drives. More particularly, the disclosure relates to systems and methods for automatic and on-demand testing of non-volatile storage devices.

2. Description of the Related Art

Non-volatile storage drives are used in a number of applications, such as, for example, desktop, laptop, notebook, sub-notebook, tablet and embedded computers. Printed circuit boards associated with non-volatile memory device assemblies are often tested to determine aspects of the overall health of the hardware circuit board. For example, such testing may be executed by code downloaded to memory after initialization of a printed circuit board assembly (PCBA). However, such an implementation may undesirably cause hardware tests to run on every cold boot or power-up, even if similar tests have already been run and passed during a prior boot.

BRIEF DESCRIPTION OF THE DRAWINGS

Systems and methods that embody the various features of the invention will now be described with reference to the following drawings, in which.

DETAILED DESCRIPTION OF SPECIFIC EMBODIMENTS

While certain embodiments are described, these embodiments are presented by way of example only, and are not intended to limit the scope of protection. Indeed, the novel methods and systems described herein may be embodied in a variety of other forms. Furthermore, various omissions, substitutions and changes in the form of the methods and systems described herein may be made without departing from the scope of protection.

Overview

Non-volatile memory boards, such as solid state drive (SSD) boards, may not be tested prior to drive assembly and manufacturing. As a result, board firmware may initially execute on hardware that has never been tested, or validated. Testing may occur subsequent to power-up of the drive in order to confirm that the drive meets certain performance standards. As an example, memory tests may initialize memory parity. However, it may be undesirable for certain tests to be performed as a matter of course at each power-up. For example, certain tests may require an unacceptable or undesirable amount of time that may delay the boot-up. When such testing has been successfully performed previously, this may unnecessarily increase time-to-ready for a non-volatile storage device.

Some embodiments of the present invention provide comprehensive or partial PCBA testing in accordance with one or more values stored in persistent storage (e.g., non-volatile memory, magnetic storage, etc.). For example, PCBA testing may be executed in connection with initialization of the PCBA. Furthermore, some embodiments provide functionality for inhibiting future testing after one or more tests have been successfully passed. Some embodiments allow for testing to be bypassed and/or to conditionally re-run one or more tests on a subsequent power-up cycle or reset.

System Overview

Figure 1A:
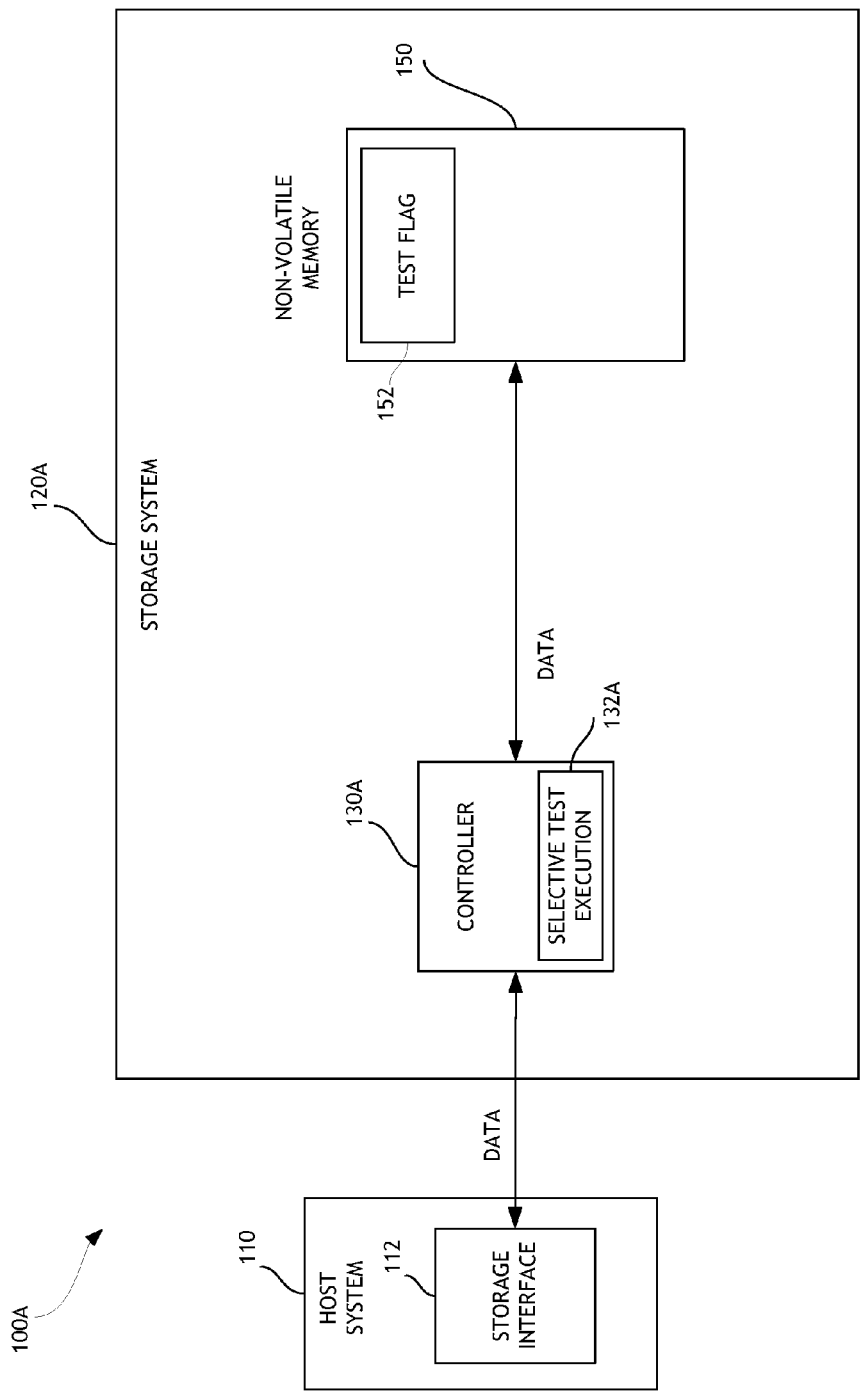
FIG. 1A is a block diagram illustrating a storage system that implements PCBA testing in accordance with one embodiment of the invention.

FIG. 1A illustrates an embodiment of a storage system 100A that may be configured to implement testing of a PCBA associated with non-volatile storage according to certain embodiments disclosed herein. As shown, a storage system 120A may include a controller 130A, which may reside on the PCBA (not shown), and a non-volatile storage memory module 150. The non-volatile memory module 150 may comprise, for example, one or more non-volatile solid-state memory arrays. The controller 130A can be configured to receive data and/or storage access commands from a storage interface module 112 (e.g., a device driver) in a host system 110. In certain embodiments, storage access commands communicated by the storage interface 112 include read and write commands issued by the host system 110. Read and write commands can specify a logical block address in the storage system. The controller 130A may be configured to execute the received commands in the non-volatile memory module 150. In one embodiment, the controller 130A may include memory (e.g., DRAM) for storing data, such as system tables.

As shown in FIG. 1A, controller 130A includes a selective test execution module 132A that controls at least certain aspects of the testing of the PCBA and non-volatile memory 150. In an embodiment, the selective test execution module 132A causes one or more tests to either be performed or bypassed in response to reading a value stored in non-volatile memory 150, namely test flag 152. Test flag 152 may be represented by any suitable value or physical configuration. In an embodiment, test flag 152 is represented by one or more bits stored in the non-volatile storage memory 150, wherein one or more bits correspond to one or more specific tests that the system 100A is configured to perform.

In certain embodiments, the non-volatile memory module 150 is implemented using NAND flash memory devices. Other types of solid-state memory devices can be used alternatively, or additionally, including flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistance RAM (RRAM), NOR memory, EEPROM, Ferroelectric Memory (FeRAM), Magnetoresistive RAM (MRAM), or other discrete NVM (non-volatile memory) chips. In certain embodiments, the memory devices comprise MLC devices and/or SLC memory devices.

Storage system 120A can store data communicated by the host system 110. That is, the storage system 120A can act as memory storage for the host system 110. To facilitate this function, the controller 130A may implement a logical interface. A logical interface can present to the host system 110 the storage system's memory as a set of logical addresses (e.g., contiguous address) where data can be stored. Internally, the controller 130A may map logical addresses to various physical memory addresses in the non-volatile memory module 150.

In one embodiment, a portion of the non-volatile memory module 150 can be used as cache. In another embodiment, the entire non-volatile memory module 150 can be used as cache. The controller 130 can store data communicated by the host system 110 in the non-volatile memory 150. To improve performance of the storage system 120A and/or host system 110, in some embodiments, various types of data can be stored in non-volatile memory cache, including frequently accessed data, data accessed at start-up (e.g., following a reset or power down), system data, sequentially accessed data, etc.

Figure 1B:
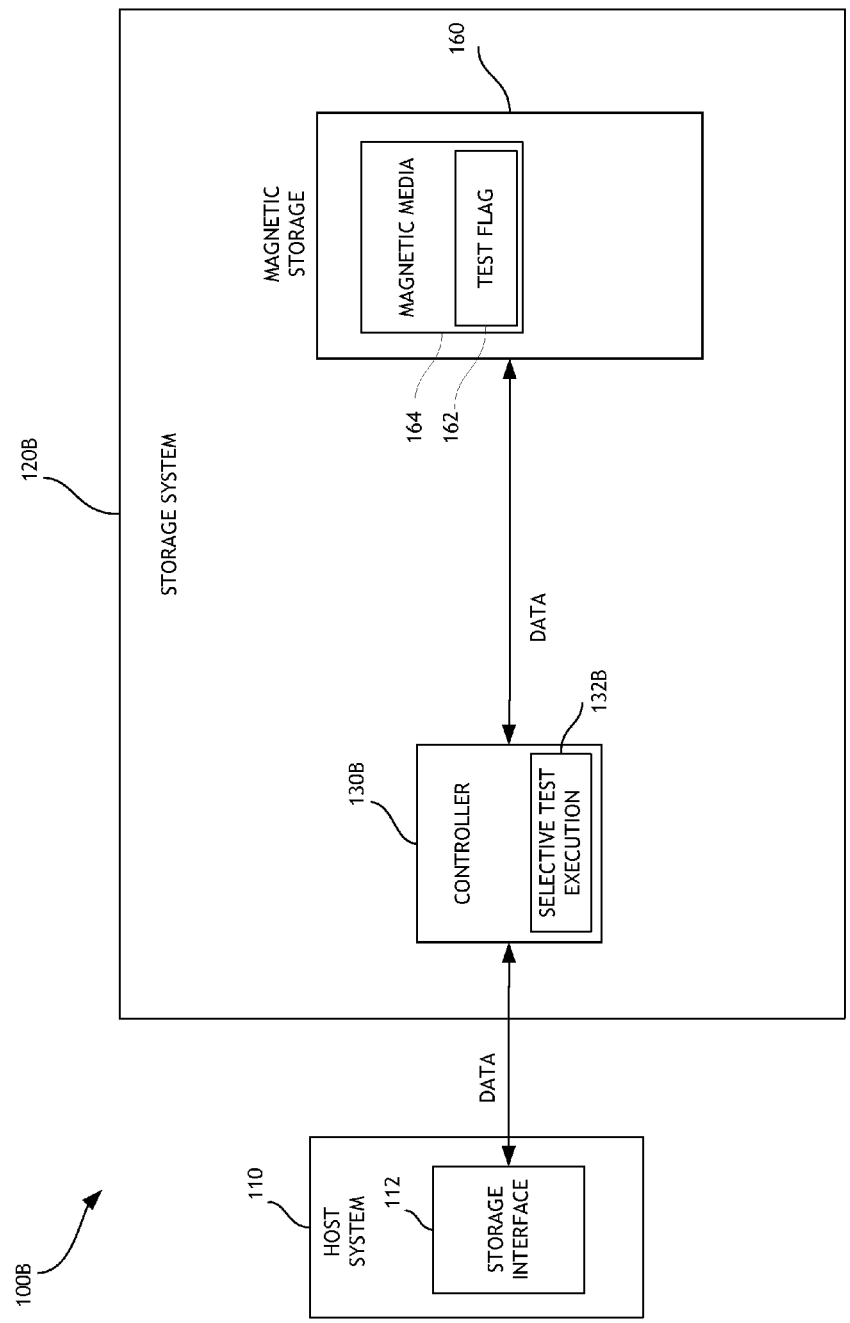
FIG. 1B is a block diagram illustrating a storage system that implements PCBA testing in accordance with one embodiment of the invention.

FIG. 1B illustrates an embodiment of a storage system 100B that may be configured to implement testing of a PCBA in accordance with certain embodiments disclosed herein. As shown, a storage system 120B (e.g., a non-volatile storage device) may include a magnetic storage module 160, which comprises magnetic media 164 (e.g., a magnetic disk). The controller 130B, which may reside on the PCBA (not shown), may be configured to execute the received commands by performing memory access operations. In an embodiment the selective test execution module 132B of the controller 130B and the test flag 162 are similar in operation and/or configuration to selective test execution module 132A and test flag 152 described above with respect to FIG. 1A.

Storage system 120B can store data communicated by the host system 110. To facilitate this function, the controller 130B may implement a logical interface that presents to the host system 110 the storage system's memory as a set of logical addresses (e.g., contiguous address) where data can be stored. Internally, the controller 130B can map logical addresses to various physical memory addresses in the magnetic media 164.

Figure 2:
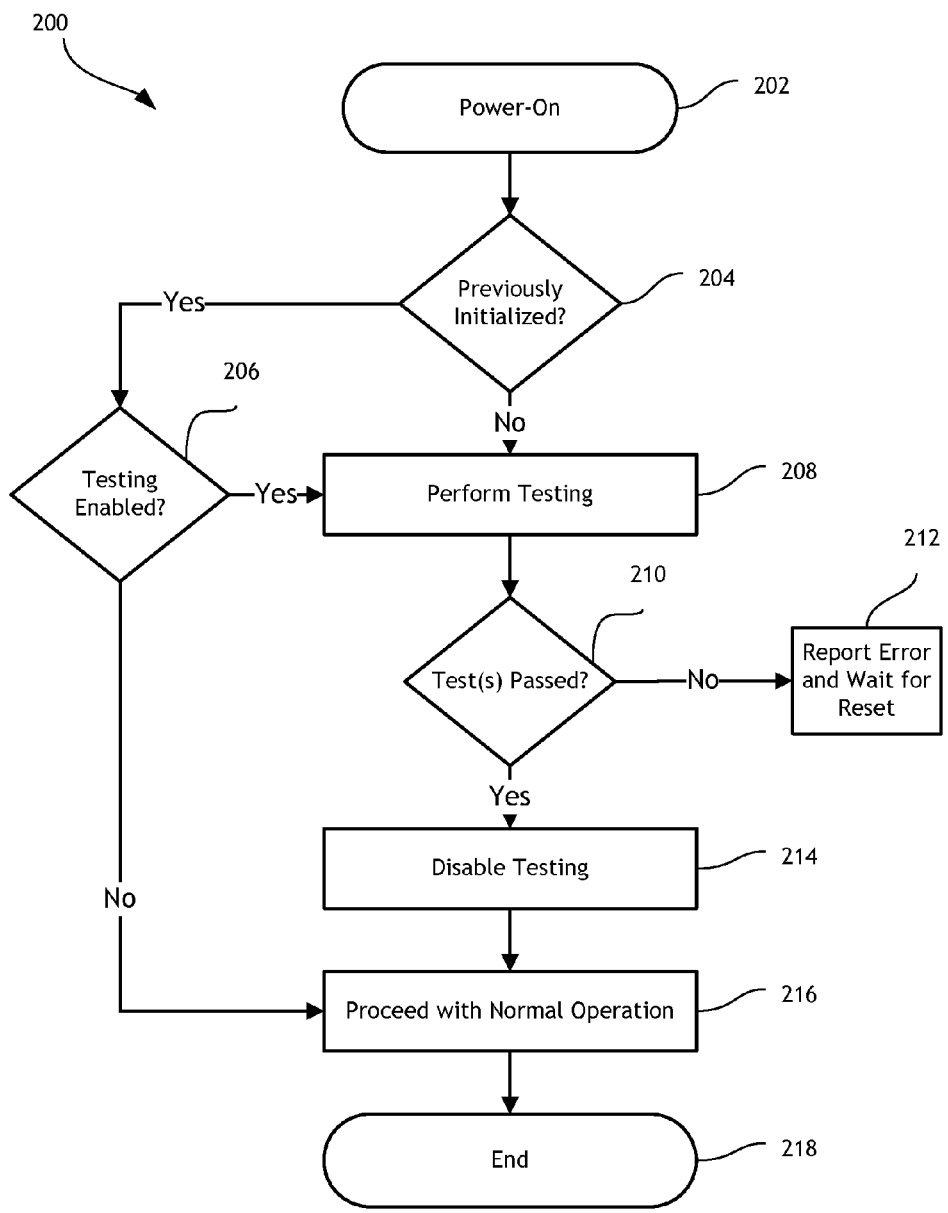
FIG. 2 is a flow diagram illustrating an embodiment of a process for testing a memory device in accordance with one embodiment of the invention.

FIG. 2 is a flow diagram illustrating an embodiment of a process 200 for testing a non-volatile storage device. The process 200 can be implemented by the controller 130A or 130B of a storage system 120A or 120B. The process starts at block 202, where a storage system is powered on. In an embodiment, the process includes erasing a non-volatile storage device prior to initialization of the storage device and/or loading one or more images onto the storage device.

At decision block 204, it is determined whether the non-volatile storage device has been previously initialized. If it is determined that the device has not yet been initialized, testing of the device is performed at block 208. Testing may include one or more tests, including, for example, a complete memory test, which validates each of a number of device parameters. In one embodiment, testing performed at block 208 includes running five or more tests. Determining whether the storage device has been previously initialized or not may involve reading a value stored in the storage device that provides such information. For example, upon initialization of the storage device the process 200 may include setting a value that indicates that the device has been initialized, such that subsequent reads of the value will indicate that the drive has been initialized. If the storage device has previously been initialized, it may be desirable to forego testing of the device, and simply proceed with normal operation without performing such testing.

In the case where it is determined that the drive has been previously initialized, the process proceeds to decision block 206, where it is determined whether testing is nevertheless desirable or required. In certain circumstances it may be desirable to enable one or more tests despite the fact that testing has been previously performed in connection with initialization of the device. Such a process is described in greater detail below in connection with FIG. 3. If it is determined that testing is not enabled at block 206, the process 200 is directed to block 216, where the storage device proceeds with normal operation, as no testing is performed. If it is determined that testing is enabled, the process 200 proceeds to testing block 208, which, as discussed above, includes the performance of one or more tests of the storage device.

After tests are performed at block 208, it is determined whether testing was successful. Successful completion of a test may require that the test return no errors or failures of any kind. Alternatively, successful completion of a test may allow for an acceptable tolerance of errors or failures. For example, if testing returns one or more errors which the storage system can satisfactorily operate in spite of, the process 200 may allow for operation of the system to proceed. In an embodiment, the process 200 proceeds to block 214 when each of the performed tests is successfully passed.

If it is determined that testing was not successful for any reason, the process 200 does not continue with normal operation. Instead, the process 200 proceeds to block 212, where relevant errors may be reported. When testing is unsuccessful, the process 200 may wait until a subsequent power cycle and attempt to run one or more of the tests again.

When it is determined that testing was successful, one or more tests is disabled at block 214. Disabling one or more tests may prevent the storage system from unnecessarily running tests in connection with subsequent power-ups. Once the relevant test, or tests, have been disable, the storage system proceeds with normal operation at 216. For example, a file system may be initialized and/or one or more images may be loaded to the storage device.

Figure 3:
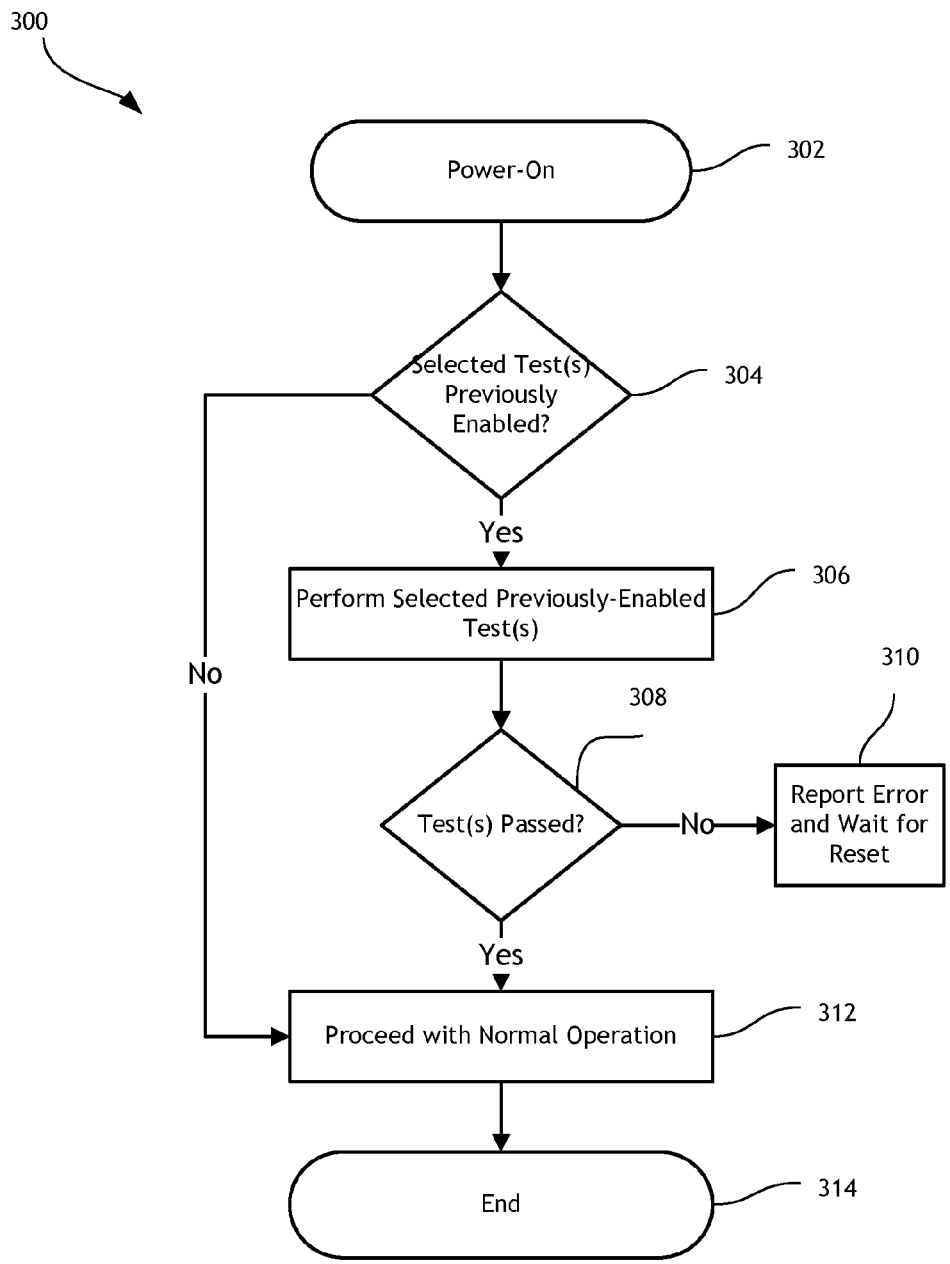
FIG. 3 is a flow diagram illustrating an embodiment of a process for selectively testing a memory device in accordance with one embodiment of the invention.

FIG. 3 is a flow diagram illustrating an embodiment of a process 300 for selectively testing a non-volatile storage device. The process 200 can be implemented by the controller 130A or 130B of a storage system 120A or 120B. In an embodiments, process 300 may be performed in connection with operation of a non-volatile storage device in an environmental chamber. It may be desirable to run, or re-run one or more particular tests of the memory storage device. Following a power-on event, which occurs at block 302, process 300 involves determining whether one or more tests have been previously enabled. Enablement of one or more tests may have been accomplished in any suitable manner. For example, the storage device may include a value that indicates whether one or more tests are enabled. In an embodiment, the value is set in response to receiving a write command from a host system. For example, such a command may be a vendor-specific command. In an embodiment, the value is set automatically by the system in response to one or more events or conditions.

If it is determined that no tests are enabled, the process 300 proceeds with normal operation of the storage device at block 312, without performing any testing. Alternatively, if it is determined that one or more tests are enabled, such tests are performed at block 308. Whether or not the process 300 then continues with normal, post-testing operation depends on whether the enabled tests are passed to the satisfaction of the relevant system. As discussed above in connection with FIG. 2, what the relevant requirements are for successful passing of a particular test may depend on the configuration of the particular system. When testing is unsuccessful, the process 300 involves reporting such results to the system. In an embodiment, the process 300 does not include error reporting. The process 300 does not proceed beyond block 310 in the case of unsuccessful testing until a subsequent power cycle or other event, at which point testing may be attempted again.

Figure 4:
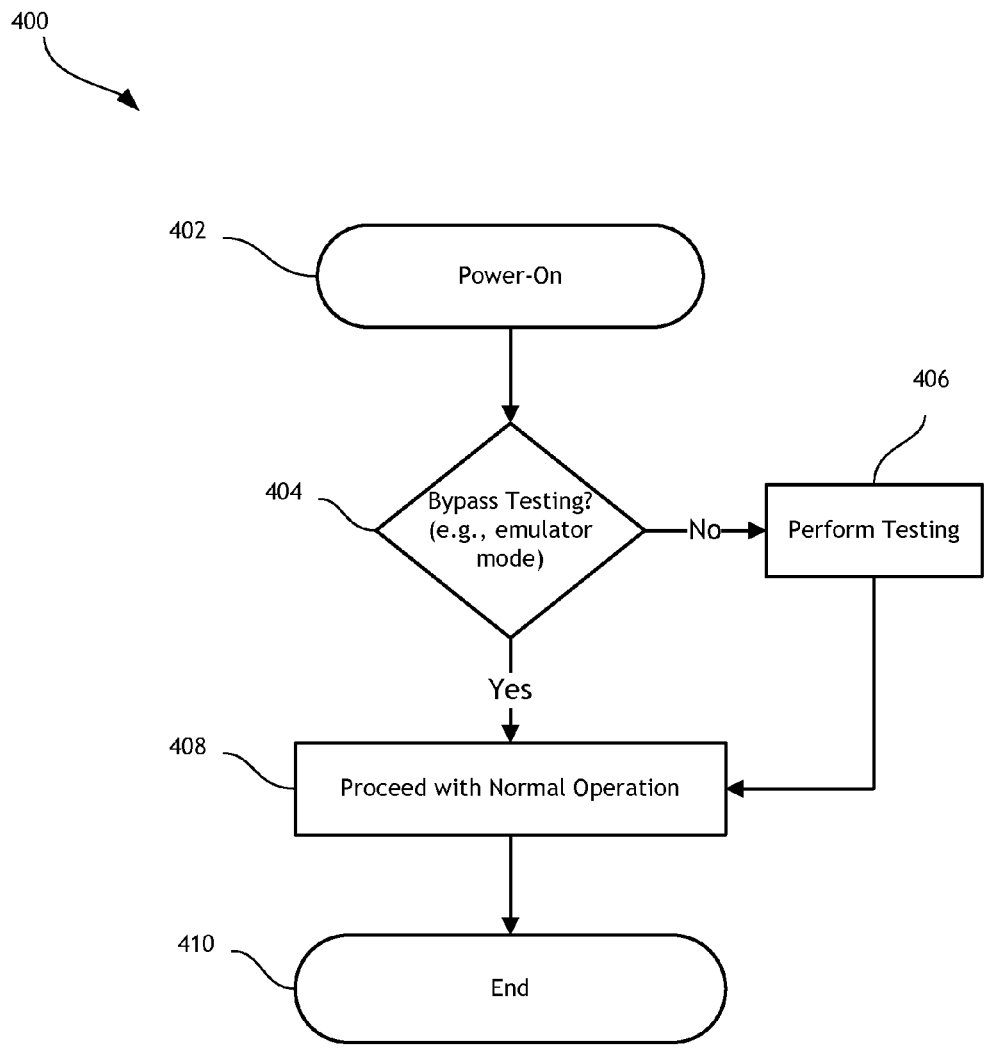
FIG. 4 is a flow diagram illustrating an embodiment of a process for bypassing testing of a memory device in accordance with one embodiment of the invention.

FIG. 4 is a flow diagram illustrating an embodiment of a process 400 for bypassing testing of a non-volatile storage device. The process 400 can be implemented by the controller 130A or 130B of a storage system 120A or 120B. Following a power-on event, which occurs at block 402, a determination is made at block 404 whether testing of the storage device is to be bypassed. Bypassing a storage device's testing procedure may be desirable for a number of reasons. For example, code from the storage device may be loaded into memory of a host system using an emulator program, such as during development. In such a case, it may be desirable to bypass testing as a matter of convenience, or for other reasons.

The storage device may include a value that indicates whether testing is to be bypassed. The value may be set automatically to indicate that testing is to be bypassed in response to one or more certain events, such as the loading of code from the device using an emulator program. In an embodiment, the value is set to indicate that testing is to be bypassed in response to a command received from a host system, such as, for example, a vendor-specific command.

When it is determined at block 404 that testing is not to be bypassed, testing is performed in accordance with the system's standard testing procedure, or according to some other specified procedure, after which the process 400 proceeds with normal operation of the storage device at block 408. When it is determined that testing is to be bypassed, the process 400 proceeds with normal operation at block 408 without performing testing.

CONCLUSION

In some embodiments, utilizing a value stored in persistent storage can allow for improved efficiency of a non-volatile storage device system in connection with testing of a PCBA of the non-volatile storage device system. The value may provide information indicating whether one or more tests have been previously performed, or are enabled. In certain embodiments, the value may be modified automatically in response to certain events, or may be modified in response to a command received from a host system. It may be desirable to run one or more tests only during initialization of the non-volatile storage device, and have testing disabled during subsequent power-up events. Certain embodiments disclosed above allow for such functionality. Furthermore, in an embodiment, PCBA testing may be bypassed, even when the non-volatile storage device has not previously been initialized, such as when code from the drive is loaded by an emulator program.

Other Variations

As used in this application, "non-volatile memory" typically refers to solid-state memory such as, but not limited to, NAND flash. However, the systems and methods of this disclosure may also be useful in more conventional hard drives and hybrid drives including both solid-state and hard drive components. The systems and methods of this disclosure may also be useful for a RAID system (e.g., server RAID system) having multiple storage devices, such as, a storage module with SLC flash, a storage module with MLC flash, a storage module with magnetic storage, etc. The solid-state storage devices (e.g., dies) may be physically divided into planes, blocks, pages, and sectors, as is known in the art. Other forms of storage (e.g., battery backed-up volatile DRAM or SRAM devices, magnetic disk drives, etc.) may additionally or alternatively be used.

Those skilled in the art will appreciate that in some embodiments, other types of caching policies can be implemented. In addition, the actual steps taken in the processes shown in FIGS. 2-4 may differ from those shown in the figures. Depending on the embodiment, certain of the steps described above may be removed, others may be added. Accordingly, the scope of the present disclosure is intended to be defined only by reference to the appended claims.

While certain embodiments have been described, these embodiments have been presented by way of example only, and are not intended to limit the scope of protection. Indeed, the novel methods and systems described herein may be embodied in a variety of other forms. Furthermore, various omissions, substitutions and changes in the form of the methods and systems described herein may be made. The accompanying claims and their equivalents are intended to cover such forms or modifications as would fall within the scope and spirit of the protection. For example, the various components illustrated in the figures may be implemented as software and/or firmware on a processor, ASIC/FPGA, or dedicated hardware. As another example, various memory tiers disclosed herein can be part of a storage module and/or device or can be separated into different storage modules and/or devices, such as, when used in a RAID system. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A method of testing a non-volatile storage system comprising a non-volatile storage medium and a controller, the method comprising:
   determining whether execution of a test is enabled by accessing a value stored on the non-volatile storage medium, the value indicating whether the test is to be executed again regardless of a prior successful execution of the test;
   when execution of the test is enabled:
      performing a second execution of the test, the second execution of the test occurring at a point in time after a first execution of the test, wherein the first execution of the test comprises a successful execution of the test; and
      determining whether the second execution of the test has been performed successfully; and
   when the second execution of the test has been performed successfully, modifying the value, as stored on the non-volatile storage medium, to indicate that execution of the test is disabled to prevent the test from being executed on a subsequent power-up cycle of the non-volatile storage system.

2. The method of claim 1, wherein determining whether the execution of the test is enabled further comprises making a determination of whether the non-volatile storage system has previously been initialized.

3. The method of claim 2, wherein a determination that the non-volatile storage system has not been previously initialized indicates that the execution of the test is enabled.

4. The method of claim 1, further comprising modifying the value to indicate that the execution of the test is enabled in response to receiving a request from a host system.

5. The method of claim 4, wherein the request comprises a vendor specific command not included in a command set of a storage interface between the host system and the non-volatile storage system.

6. The method of claim 1, wherein the value is represented by a flag stored on the non-volatile storage medium.

7. The method of claim 1, wherein the non-volatile storage medium comprises flash memory.

8. The method of claim 1, wherein the non-volatile storage medium comprises magnetic storage.

9. The method of claim 1, further comprising reporting to a host system when execution of the test was unsuccessful.

10. A method of managing the testing of a non-volatile storage system comprising a non-volatile storage medium and a controller, the method comprising:
   receiving a command from a host system in operative communication with the non-volatile storage system;
   setting a value stored on the non-volatile storage medium in response to receiving the command, the value indicating whether a test is to be executed again regardless of a prior successful execution of the test; and
   using the value to determine whether to execute the test on a subsequent power-up cycle of the non-volatile storage system, wherein the test is performed successfully in a prior time period,
   wherein said method is performed by the non-volatile storage system.

11. The method of claim 10, wherein the value indicates that at least one test of a plurality of tests will be executed and at least one test of the plurality of tests will not be executed when the non-volatile storage system is subsequently powered up.

12. The method of claim 10, wherein the value is represented by a plurality of bits, wherein each of the plurality of bits relates to one of the one or more tests.

13. The method of claim 10, wherein setting the value is performed in response to the command issued by an emulator program of the host system.

14. A non-volatile storage system comprising:
   a non-volatile storage medium; and
   a controller configured to:
      access a value stored on the non-volatile storage medium that indicates whether a test is to be executed again regardless of a prior successful execution of the test;
      when execution of the test is enabled:
         perform a second execution of the test, the second execution of the test occurring at a point in time after a first execution of the test, wherein the first execution of the test comprises a successful execution of the test; and
         determine whether the second execution of the test has been performed successfully; and
      when the second execution of test has been performed successfully, modify the value to indicate that execution of the test is disabled.

* * * * *